US006438387B1

United States Patent
Ichikawa (10) Patent No.: US 6,438,387 B1
(45) Date of Patent: Aug. 20, 2002

(54) RADIO COMMUNICATION DEVICE AND TRANSMISSION POWER CONTROL METHOD FOR RADIO COMMUNICATION DEVICE

(75) Inventor: Yasufumi Ichikawa, Kanagawa (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/340,305

(22) Filed: Jun. 28, 1999

(30) Foreign Application Priority Data

Aug. 7, 1998 (JP) .......................................... 10-224531

(51) Int. Cl.[7] ............................................... H04Q 7/00
(52) U.S. Cl. ....................... 455/522; 455/126; 455/127; 455/69; 330/133; 330/51; 370/335
(58) Field of Search ........................... 455/522, 69, 115, 455/116, 126, 127; 370/335; 375/345; 330/133, 51

(56) References Cited

U.S. PATENT DOCUMENTS

| 5,128,629 A | | 7/1992 | Trinh | |
|---|---|---|---|---|
| 5,379,338 A | * | 1/1995 | Umemoto et al. | 379/58 |
| 5,752,770 A | * | 9/1998 | Kasamatsu | 455/126 |
| 5,809,420 A | * | 9/1998 | Ichhiyanagi | 455/103 |
| 5,852,770 A | * | 12/1998 | Kasamatsu | 455/126 |
| 6,038,432 A | * | 3/2000 | Onoda | 455/127 |
| 5,265,935 A1 | * | 6/2001 | Kaneda | 330/51 |

FOREIGN PATENT DOCUMENTS

EP 883 250 A2 12/1998

OTHER PUBLICATIONS

WO 99/25064, Dualband Power Amplifier Control Using a Single Power Amplifier Controller. May 20, 1999.

* cited by examiner

Primary Examiner—William Trost
Assistant Examiner—Dahn C Le
(74) Attorney, Agent, or Firm—Pearne & Gordon LLP (57) ABSTRACT

A radio communication device has a variable resistor 20 and a power amplifier 21 and a variable power amplifier 22 as variable power amplification means. Gain control of the variable resistor 20 and the variable power amplifier 22 is performed for controlling transmission power of the radio communication device so that detection power detected in a first transmission power detection section 26 and detection power detected in a second transmission power detection section 27 are made equal by a variable power amplification control section 31. At this time, when the detection power difference becomes zero, the variable resistor 20 and the power amplifier 21 are switched off under the control of a switch control section 29 for prolonging the time period over which power supply is stopped.

12 Claims, 7 Drawing Sheets

RADIO COMMUNICATION DEVICE AND TRANSMISSION POWER CONTROL METHOD FOR RADIO COMMUNICATION DEVICE

BACKGROUND OF THE INVENTION

This invention relates to a radio communication device for use with a mobile communication equipment for carrying out mobile communication such as a portable telephone and a transmission power control method in the radio communication device.

A mobile communication equipment such as a portable telephone generally used is equipped with a function of controlling its own transmission power in response to the distance between a base station and the mobile station when information is transmitted. In a communication system of multiple access type for multiplexing communication channels, transmission power control for fixing power of signals arriving at the base station is absolutely necessary to reduce interference between the communication channels and improve frequency use efficiency.

Particularly with mobile communication equipment adopting a CDMA (code division multiple access) system using spread spectrum modulation techniques, a number of users share a single frequency band, thus the possibility is high that a so-called masking problem in which a signal having large power masks a power having small power will occur, and a problem occurs in which a signal of any other station degrades the line quality of the home station as an interference wave. To solve this problem, hitherto, various transmission power control techniques have been studied; particularly, a transmission power control system with a closed loop is known as a transmission power control system for responding to an interference signal changing instantaneously.

In the CDMA system, highly linear transmission power control in a wide range (for example, 70 to 80 dB) is required. Further, in a wide-band CDMA (W-CDMA) system being developed at present as a next-generation mobile communication system, accuracy requirement of transmission power at the large power time is high and transmission power control of higher accuracy is required.

Figure 7:
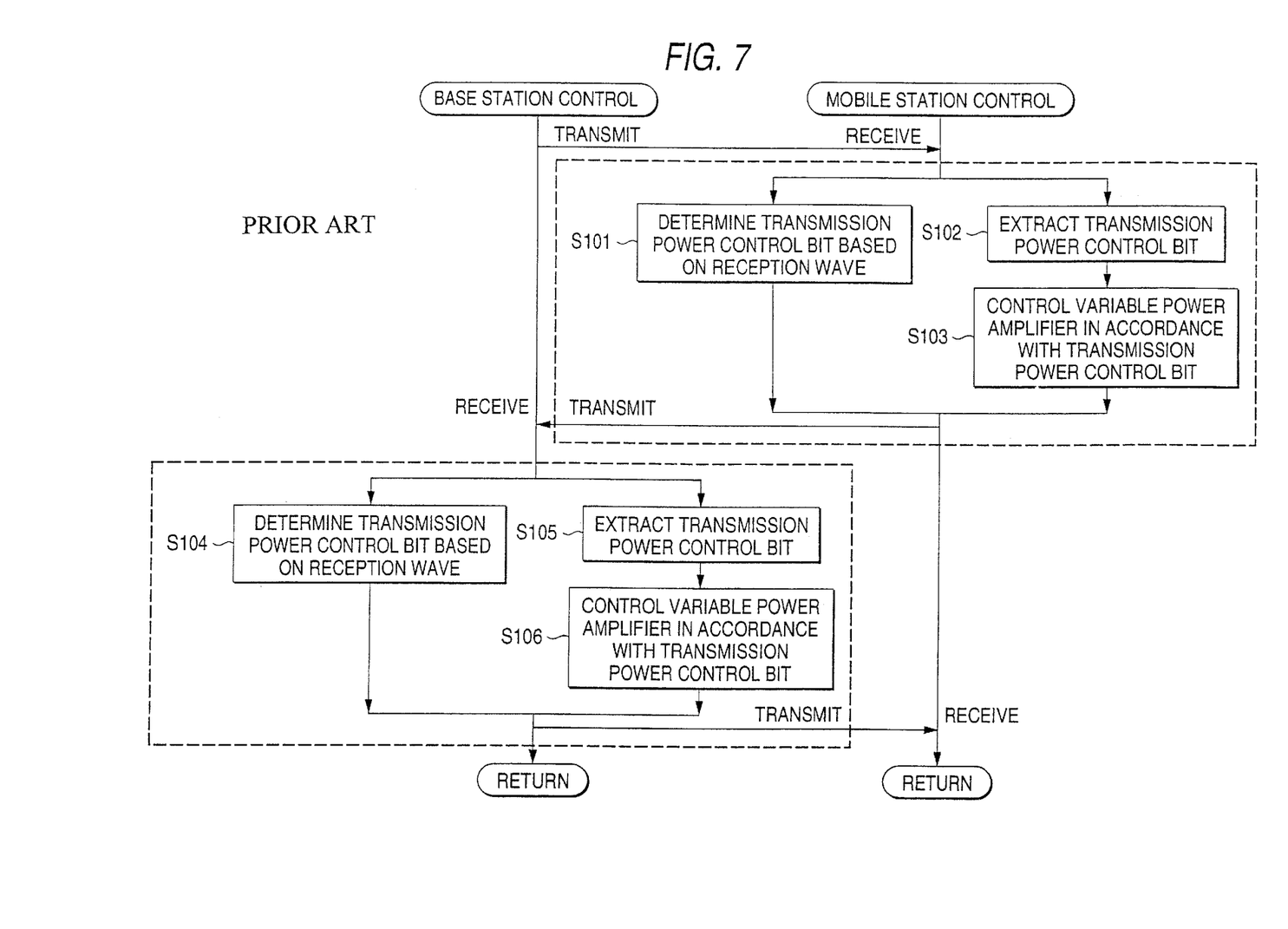
FIG. 7 is a flowchart to show an example of a transmission power control method in a related art.

FIG. 7 is a flowchart to show an example of a transmission power control method in a related art with a closed loop. For a base station and a mobile station to communicate with each other, the mobile station determines a transmission power control bit based on the reception power of a reception wave (desired wave) from the base station at step S101, inserts the transmission power control bit into a transmission signal, and transmits the resultant signal to the base station. The base station receives the signal transmitted from the mobile station, extracts the transmission power control bit from the reception signal at step S105, and controls a variable power amplifier in the base station as indicated in the transmission power control bit at step S106.

Likewise, the base station determines a transmission power control bit based on reception power of the reception wave from the mobile station at step S104, inserts the transmission power control bit into a transmission signal, and transmits the resultant signal to the mobile station. The mobile station receives the signal transmitted from the base station, extracts the transmission power control bit from the reception signal at step S102, and controls a variable power amplifier in the mobile station as indicated in the transmission power control bit at step S103.

Such transmission power control is performed, thereby making it possible to hold reception power almost constant at the base and mobile stations regardless of where the mobile station is located.

To perform transmission power control of high accuracy by the transmission power control method in the related art as described above, variable power amplifiers of high accuracy are required and need to be controlled with high accuracy. However, if an attempt is made to provide variable power amplifier control of high accuracy using variable power amplifiers of high accuracy, the circuit scale becomes large, the power consumption amount increases, and the system or the unit with the variable power amplifier becomes expensive. It may be difficult to cover a wide range of gain control while high accuracy is maintained with one variable power amplifier. Therefore, considering power consumption, portability, system (device) costs, etc., various difficulties are involved in providing transmission power control of high accuracy by the transmission power control method in the related art.

SUMMARY OF THE INVENTION

It is therefore an object of the invention to provide a radio communication device that can provide transmission power control means for less consuming power in a simple configuration for improving accuracy of transmission power control and can be miniaturized with lower power consumption and a transmission power control method in the radio communication device.

To the end, according to the invention, there is provided a radio communication device having a transmission power control function of controlling power transmitted to a station to communicate with, the radio communication device comprising variable power amplification means including at least first and second variable power amplifiers, each capable of varying its amplification gain, variable power amplification control means for controlling the variable power amplification means, transmission power detection means for detecting transmission power of the radio communication device based on output of the variable power amplification means, and switch control means for performing switch control for the operation of the variable power amplification means in response to the detected transmission power.

Further, the transmission power detection means detects first detection power based on output of the first variable amplifier and second detection power based on output of the second variable power amplifier, the variable power amplification control means controls the first and second variable power amplifiers in response to a transmission power control bit sent from a station to communicate with and the difference between the first detection power and the second detection power, and the switch control means switches the operation of the first variable power amplifier and the operation of the second variable power amplifier in response to the detection power difference.

Furthermore, the variable power amplification control means controls the first and second variable power amplifiers so that the detection power difference approaches zero, and the switch control means turns off the first variable power amplifier when the detection power difference is almost eliminated.

Moreover, the radio communication device further includes analog-digital batch conversion means having a first multiplier for multiplying the first detection power and the second detection power by random code having orthogonality, an adder for adding output of the first multiplier, an analog-digital converter for converting output of the adder into digital signal, and a second multiplier for multiplying output of the analog-digital converter by the random code as means for converting the first detection power and the second detection power output from the transmission power detection means into digital signals in batch.

According to the invention, there is provided a transmission power control method in a radio communication device for controlling power transmitted to a station to communicate with, the transmission power control method comprising a variable power amplification control step of controlling a variable power amplification means including at least first and second variable power amplifiers, each capable of varying its amplification gain, a transmission power detection step of detecting transmission power of the radio communication device based on output of the variable power amplification means, and a switch control step of performing switch control for the operation of the variable power amplification means in response to the detected transmission power.

Further, the transmission power detection step detects first detection power based on output of the first variable power amplifier and second detection power based on output of the second variable power amplifier, the variable power amplification control step controls the first and second variable power amplifiers in response to a transmission power control bit sent from a station to communicate with and the difference between the first detection power and the second detection power, and the switch control step switches the operation of the first variable power amplifier and the operation of the second variable power amplifier in response to the detection power difference.

Furthermore, the variable power amplification control step controls the first and second variable power amplifiers so that the detection power difference approaches zero, and the switch control step turns off the first variable power amplifier when the detection power difference is almost eliminated.

Moreover, the transmission power control method further comprises the analog-digital batch conversion steps containing a first multiplication step of multiplying the first detection power and the second detection power by random code having orthogonality, an addition step of adding output of the first multiplication step, an analog-digital conversion step of converting output of the addition step into digital signal, and a second multiplication step of multiplying output of the analog-digital conversion step by the random code as steps of converting the first detection power and the second detection power output from the transmission power detection step into digital signals in batch.

In the radio communication device and the transmission power control method of the invention, switch control is performed for the operation of the variable power amplification means containing the first and second variable power amplifier in response to the detected transmission power, and power transmitted to the station to communicate with. At this time, the variable power amplification means are switched for operation in response to the detected transmission power, so that a wide range of transmission power control can be performed with high accuracy in the simple configuration; the operation of variable power amplification means can be turned off for lower power consumption and the unit can be miniaturized.

Further, in the radio communication device and the transmission power control method, the first detection power based on output of the first variable power amplifier and the second detection power based on output of the second variable power amplifier are detected, the first and second variable power amplifiers are controlled in response to the difference between the first detection power and the second detection power and the transmission power control bit sent from the station to communicate with, and the operation of the first power amplifier and the operation of the second variable power amplifier are switched in response to the detection power difference. Thus, it is made possible to reduce power consumption by turning off the operation of variable power amplification means while the accuracy of the transmission power control is maintained.

Furthermore, in the radio communication device and the transmission power control method, the first and second variable power amplifiers are controlled so that the detection power difference approaches zero, and the first power amplifier is turned off when the detection power difference is almost eliminated, whereby the time period over which power supply to the variable power amplification means is stopped can be prolonged, thus the number of circuits that can be powered off can be increased, and power consumption can be decreased.

Moreover, in the radio communication device and the transmission power control method, the first detection power and the second detection power are multiplied by random code having orthogonality, the results are added, and the resultant signal is converted from analog form into digital form, then the digital signal is multiplied by the above-mentioned random code, whereby the digital signal is separated corresponding to the former analog signals, namely, the first detection power and the second detection power can be converted into digital signals in batch. Thus, the number of the circuits of the analog-digital converter, etc., can be reduced and the unit can be miniaturized.

DESCRIPTION OF THE PREFERRED EMBODIMENTS

Referring now to the accompanying drawings, there is shown a preferred embodiment of the invention.

Figure 1:
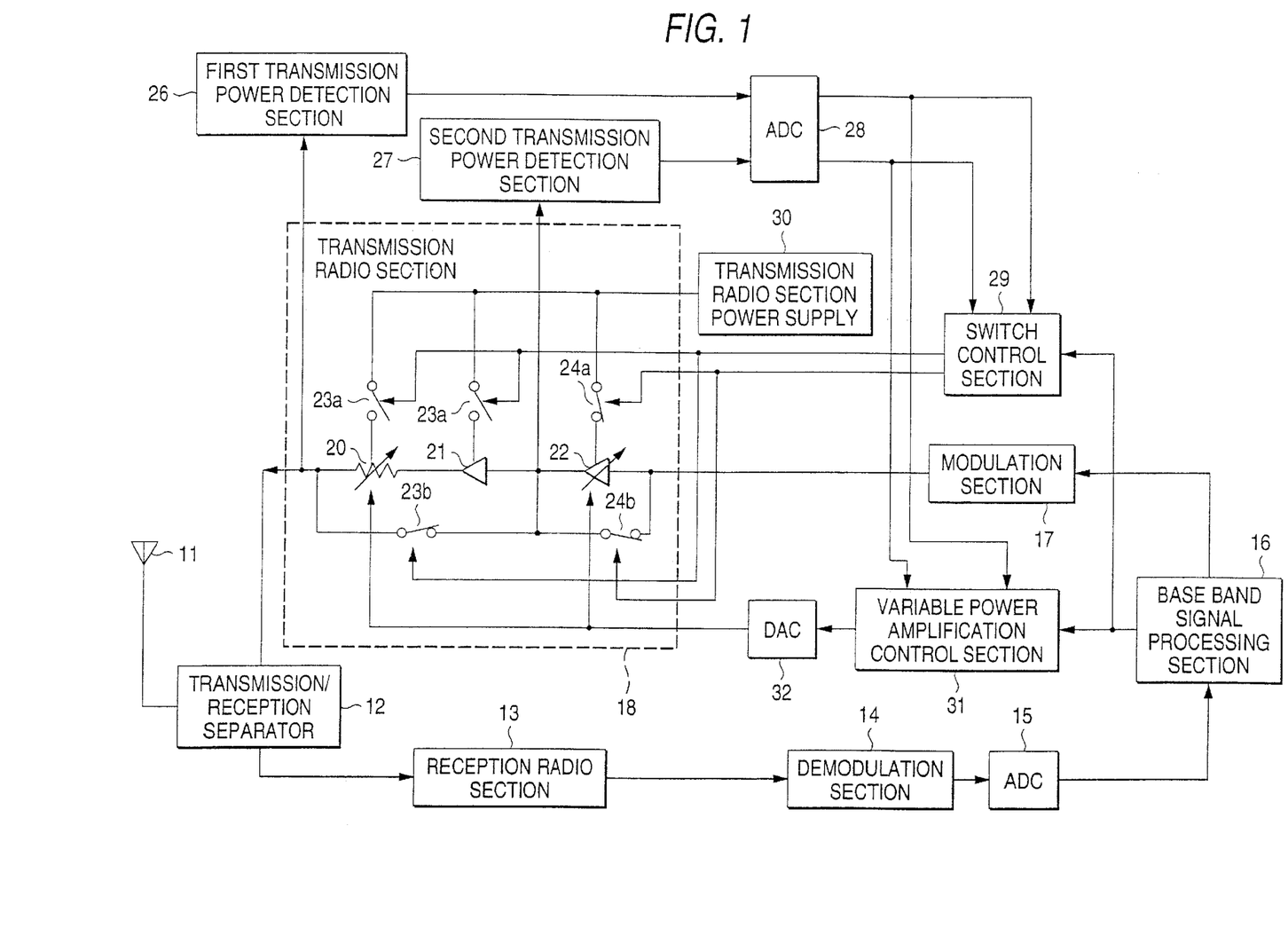
FIG. 1 is a block diagram to show the configuration of the main part of a radio communication device according to one embodiment of the invention.
Figure 2:
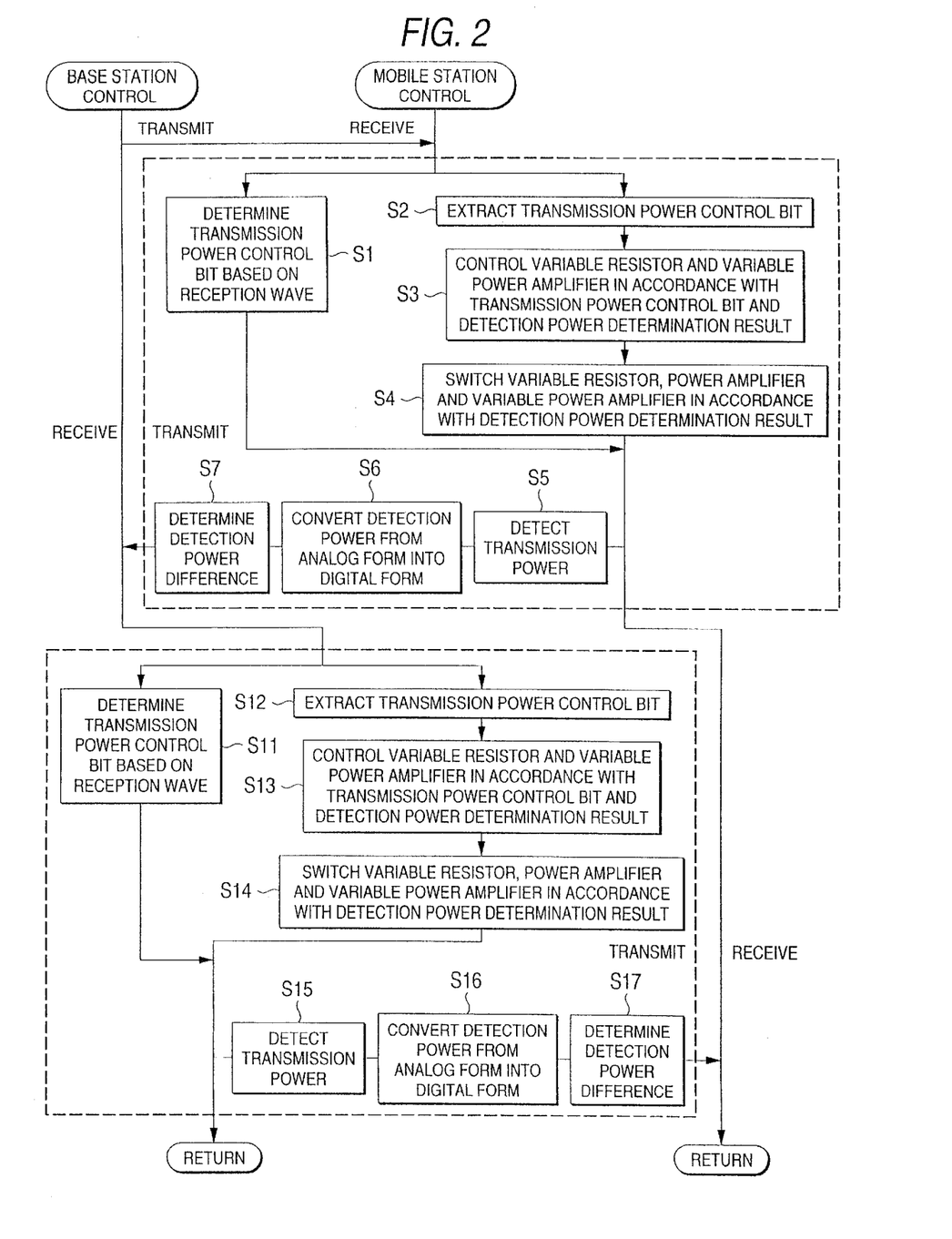
FIG. 2 is a flowchart to show the sequence of a transmission power control method according to the embodiment of the invention.

FIG. 1 is a block diagram to show the configuration of the main part of a radio communication device according to one embodiment of the invention. FIG. 2 is a flowchart to show the sequence of a transmission power control method according to the embodiment of the invention.

A radio communication device of the embodiment is installed in, for example, a mobile communication equipment, etc., forming a base station or a mobile station in a cellular communication system for power amplifying a signal containing transmission information and transmitting the power-amplified signal to a party to communicate with. A transmission power control method described here is fitted particularly to cases where it is necessary to perform transmission power control of high accuracy with high linearity held in a wide power control range, such as mobile communication equipment of the CDMA system, etc. However, the embodiment can be applied not only to the mobile communication equipment, but also to other radio communication devices requiring similar transmission power control.

The radio communication device of the embodiment has an antenna 11 for transmitting and receiving radio signals, a transmission/reception separator for separating transmission and reception signals, and a reception block consisting of a reception radio section 13 for converting the frequency of a reception signal into an IF band (intermediate frequency band), a demodulation section 14 for converting a reception signal into a base band signal, an analog-digital converter (ADC) 15 for converting an analog signal into a digital signal, and a base band signal processing section 16 for performing signal processing, decoding, etc., of a received base band signal.

The radio communication device further includes a transmission block consisting of the base band signal processing section 16 for performing signal processing, coding, etc., of a base band signal to be transmitted, a modulation section 17 for converting the frequency of a transmission signal into an IF band, and a transmission radio section 18 for performing power amplification of a transmission signal, frequency conversion of a transmission signal to an RF band (radio frequency band), etc. The transmission radio section 18 is provided with a variable resistor 20, a power amplifier 21, a variable power amplifier 22, first switches 23a and 23b for turning on and off the variable resistor 20 and the power amplifier 21, and second switches 24a and 24b for turning on and off the variable power amplifier 22.

The radio communication device further includes a transmission power control block consisting of the base band signal processing section 16, the variable resistor 20, the power amplifier 21, the variable power amplifier 22, the switches 23a, 23b, 24a, and 24b, a first transmission power detection section 26 and a second transmission power detection section 27 as transmission power detection means for detecting transmission power of the radio communication device emitted from the antenna 11, an analog-digital conversion circuit (ADC) 28 for converting the above-mentioned analog signal into a digital signal in batch, a switch control section 29 as switch control means for performing switch control of the switches 23a, 23b, 24a, and 24b, a transmission radio section power supply 30 for supplying power to the variable resistor 20, the power amplifier 21, and the variable power amplifier 22, a variable power amplification control section 31 as variable power amplification control means for performing gain control of the variable resistor 20 and the variable power amplifier 22, and a digital-analog converter (DAC) 32 for converting a digital signal into an analog signal. The first transmission power detection section 26 detects output of the variable resistor 20 and the second transmission power detection section 27 detects output of the variable power amplifier 22.

The variable resistor 20, the power amplifier 21, and the variable power amplifier 22 are provided for varying an amplification gain covering the range of about 70 dB in total, for example. The variable resistor 20 and the power amplifier 21 can vary the gain in the range of 30 dB and the variable power amplifier 22 can vary the gain in the range of 40 dB, for example. The variable resistor, the power amplifier, and the variable power amplifier are not limited to the configuration of the embodiment; two or more variable resistors, two or more power amplifiers, and two or more variable power amplifiers may be provided.

In the embodiment, the variable resistor 20, the power amplifier 21, and the variable power amplifier 22 are ON-OFF controlled in response to the value of the detected transmission power of the radio communication device, which will be hereinafter referred to as detection power. More particularly, either the variable resistor 20 and the power amplifier 21 or the variable power amplifier 22 is turned off in response to the difference between the detection power detected by the first transmission power detection section 26 and that detected by the second transmission power detection section 27. For example, when the detection power difference becomes zero, the variable resistor 20 and the power amplifier 21 are turned off.

If the unit shown in FIG. 1 is installed in a mobile station, the base band signal processing section 16 determines a transmission power control bit based on the reception power of a reception wave (desired wave) from a base station and inserts the transmission power control bit into a transmission signal. The transmission signal has its frequency converted into the IF band by the modulation section 17 and further has the frequency converted into the RF band by the transmission radio section 18, then is transmitted via the transmission/reception separator 12 through the antenna 11 to the base station. Also, the transmission signal is detected by the first transmission power detection section 26 and the second transmission power detection section 27, detection power from the detection section 26 and that from the detection section 27 are converted into digital signals in batch by the analog-digital conversion circuit 28, and the digital signals are sent to the switch control section 29 and the variable power amplification control section 31.

On the other hand, a signal transmitted from the base station is received at the antenna 11 and is input via the transmission/reception separator 12 to the reception radio section 13. The reception signal has its frequency converted into the IF band by the reception radio section 13 and is converted into a base band signal by the demodulation section 14, then the base band signal is converted into a digital signal by the analog-digital converter 15 and the digital signal is input to the base band signal processing section 16.

The base band signal processing section 16 extracts a transmission power control bit from the digital signal input from the analog-digital converter 15. The transmission power control bit is sent to the switch control section 29 and the variable power amplification control section 31. The variable power amplification control section 31 outputs a controlled variable based on the transmission power control bit indication and the detection power values and sends the controlled variable through the digital-analog converter 32 to the variable resistor 20 and the variable power amplifier 22 for controlling the variable resistor 20 and the variable power amplifier 22. At this time, gain control of the variable resistor 20 and the variable power amplifier 22 is performed so that the above-mentioned detection power difference becomes 0 (dB) for controlling transmission power output from the antenna 11.

Next, the switch control section 29 switches on and off the operation of the variable resistor 20 and the power amplifier 21 and the operation of the variable power amplifier 22 in accordance with the transmission power control bit indication and the detection power values.

FIG. 1 shows that the variable resistor 20 and the power amplifier 21 are off and the variable power amplifier 22 is on. Since the variable resistor 20 and the power amplifier 21 are off, the first switches 23a and 23b turn off the circuit to which power is supplied from the transmission radio section power supply 30 (the switch 23a is open) and turn on a bypass circuit (the switch 23b is closed). On the other hand, since the variable power amplifier 22 is on, the second switches 24a and 24b turn on the circuit to which power is supplied from the transmission radio section power supply 30 (the switch 24a is closed) and turn off the bypass circuit (the switch 24b is open).

In the embodiment, one variable power amplification means consisting of the variable resistor and the power amplifier and another variable power amplification means of the variable power amplifier are provided for performing gain control while covering a wide range, enabling transmission power control of high accuracy. At this time, the difference between detection power in output of the former variable power amplification means and that in output of the latter variable power amplification means is found and when the detection power difference becomes zero, the variable resistor and the power amplifier are turned off, whereby the time period over which the variable resistor and the power amplifier are off can be extended. When they are off, power supply can be stopped, so that power consumption can be reduced. Therefore, the duration of the battery can be prolonged and the standby time and the conversation time can be extended. Transmission power adjustment responsive to distance change between the units such as a base station and the mobile station and that responsive to variation in the ambient environment, etc., can be made with high accuracy over a wide range by switching the two variable power amplification means.

Next, the sequence of the transmission power control method according to the embodiment will be discussed in more detail with reference to FIG. 2. For a base station and a mobile station to communicate with each other, the mobile station determines a transmission power control bit based on the reception power of a reception wave (desired wave) from the base station at step S1, inserts the transmission power control bit into a transmission signal, and transmits the resultant signal to the base station. On the other hand, the base station detects at least two or more transmission power (detection power) values of the base station (in the example in FIG. 1, output power of the variable resistor and output power of the variable power amplifier) at step S15 and converts the detection power values from analog form into digital form at step S16, then determines the detection power difference at step S17.

Next, the base station receives the signal transmitted from the mobile station, extracts the transmission power control bit from the reception signal at step S12, and controls the variable resistor and the variable power amplifier as indicated in the transmission power control bit and in accordance with the detection power determination result, thereby varying the gains of the variable resistor and the variable power amplifier for controlling transmission power at step S13.

At step S13, the base station controls the variable resistor and the variable power amplifier so that the detection power difference becomes 0 (dB) and the transmission power satisfies the increment or decrement specified in the transmission power control bit and target power. That is, the base station changes the gains of the variable resistor and the variable power amplifier based on the indication in the transmission power control bit so that the increment or decrement of the detection power becomes equal to the increment or decrement power amount required per control step, which will be hereinafter referred to as "required increment or decrement power," and the detection power difference in outputs of the variable power amplification means approach zero.

While performing such transmission power control, the base station switches the two or more variable power amplification means in accordance with the detection power determination result (here, when the detection power difference becomes zero) and turns off the operation of one variable power amplification means (in the example in FIG. 1, the variable resistor and the variable power amplifier) for bypassing the variable power amplification means at step S14.

Since the operation of at least one variable power amplification means can be turned off by thus performing transmission power control and variable power amplification means switch control, it is made possible to extend the time period over which power supply to the variable power amplification means can be turned off. The embodiment uses the control method wherein when transmission power control is started, transmission power is adjusted by the two variable power amplification means and after the detection power values in outputs of the two variable power amplification means become equal, one variable power amplification means is turned off and transmission power control is performen by the other variable power amplification means. The control method can be used to increase the number of circuits that can be powered off and reduce power consumption as compared with use of a generation control method wherein a wide range of transmission power control is performed by one variable power amplification means or two or more variable power amplification means are always turned on for performing transmission power control.

Figure 3:
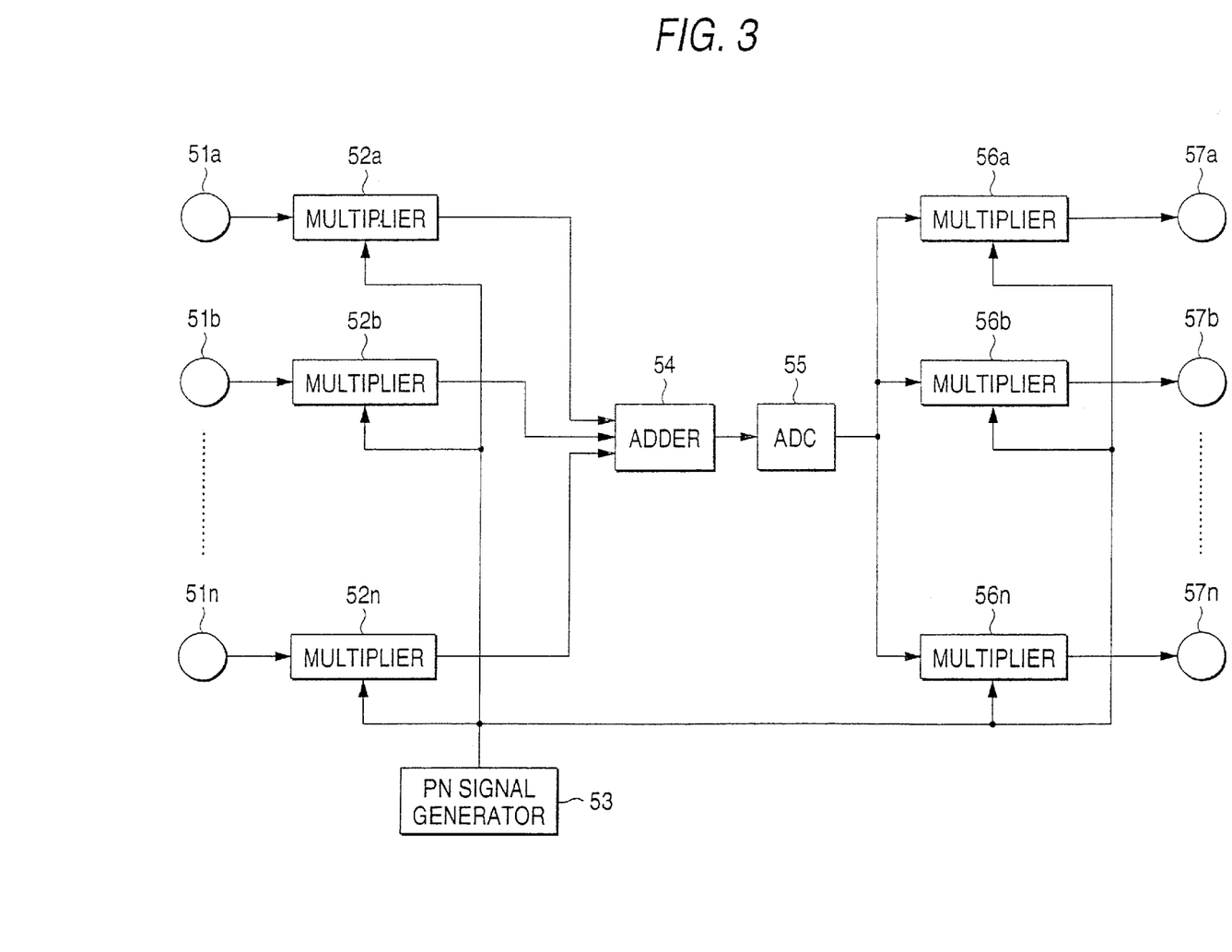
FIG. 3 is a block diagram to show the configuration of an analog-digital conversion circuit for converting detection power values into digital signals in batch.
Figure 4:
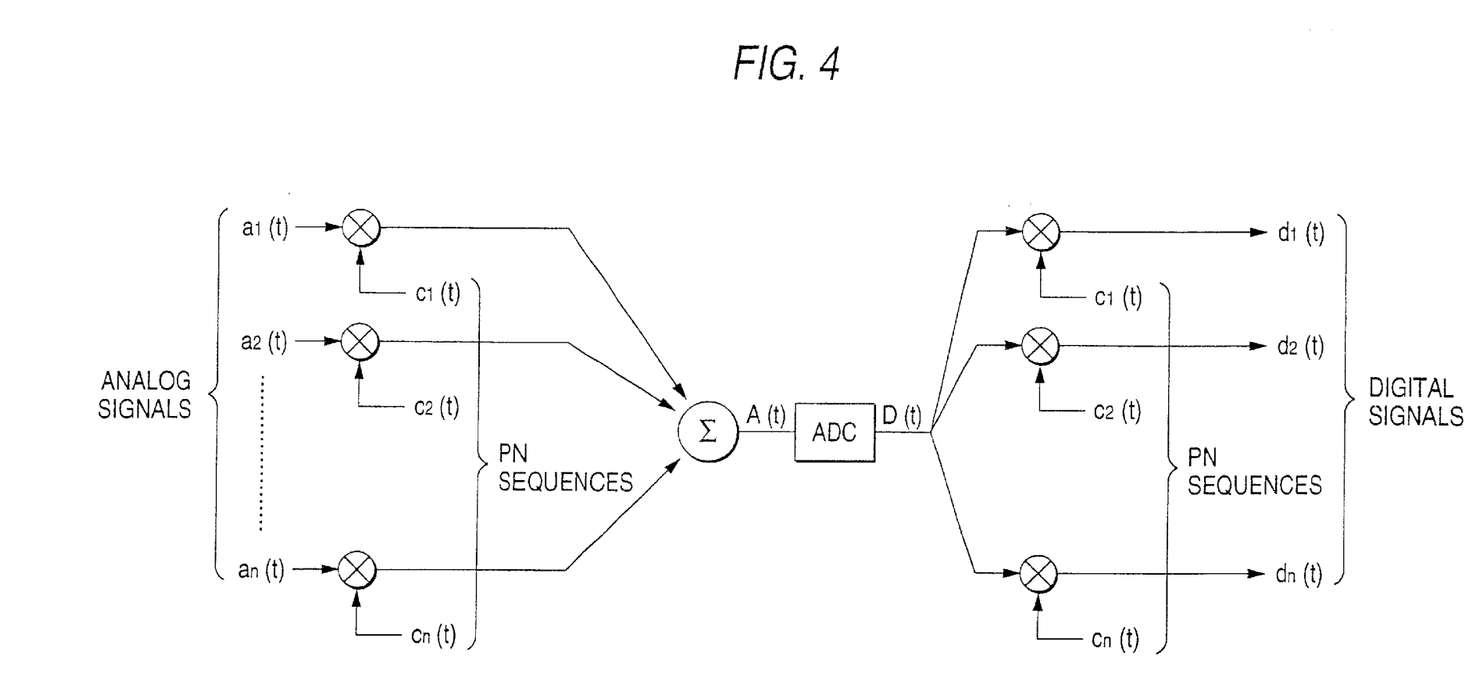
FIG. 4 is a schematic representation to show a procedure for converting detection power values into digital signals in batch.

The configuration and procedure for converting the detection power values from analog form into digital form in batch at step S16 will be discussed with reference to FIGS. 3 and 4. FIG. 3 is a block diagram to show the configuration of the analog-digital conversion circuit. FIG. 4 is a schematic representation to show the procedure for converting the detection power values into digital signals in batch. At step S16, the base station uses orthogonal signals to convert at least two or more detection power values detected at step S15 into digital signals in batch.

FIG. 3 shows an example of the internal configuration of the analog-digital conversion circuit 28 in FIG. 1. The analog-digital conversion circuit 28 has a plurality of analog signal input terminals 51a to 51n to which first multipliers 52a to 52n are connected respectively. These first multipliers 52a to 52n have output terminals connected to an adder 54. An analog-digital converter 55 is provided on the output side of the adder 54 and has an output terminal to which a plurality of second multipliers 56a to 56n are connected. These second multipliers 56a to 56n are also connected to a plurality of digital signal output terminals 57a to 57n. An PN (pseudo-noise) signal generator 53 is connected to the first multipliers 52a to 52n and the second multipliers 56a to 56n for inputting PN signals of PN sequence code.

The analog signals input through the analog signal input terminals 51a to 51n (detection power) are multiplied by PN signals generated by the PN signal generator 53 by the first multipliers 52a to 52n, and the resultant signals are added by the adder 54. The resultant analog signal provided by the adder 54 is converted into a digital signal in batch by the analog-digital converter 55. The digital signal provided by the analog-digital converter 55 is multiplied by the PN signals generated by the PN signal generator 53 by the second multipliers 56a to 56n to form separate digital signals, which then are output from the digital signal output terminals 57a to 57n.

At this time, letting the analog signal converted into a digital signal in batch be an(t), the signal required for multiplication in preprocessing and post-processing of conversion in batch be cn(t), the resultant signal provided by the adder after preprocessing be A(t), the digital signal into which A(t) is converted be D(t), and the separate digital signal provided by the multiplier after post-processing (digital signal into which an(t) is converted) be dn(t) as shown in FIG. 4, the signals are represented by the following expressions:

$$c_i(t) \cdot c_j(t) = 1 \quad (i = j)$$
$$= 0 \quad (i \neq j)$$

$$A(t) = \sum_{i=1}^{n} a_i(t) \cdot c_i(t)$$

$$D(kT) = A(t) \cdot \delta(t-kT)$$

$$d_i(kT) = a_i(t) \cdot \delta(t-kT)$$

If cn(t) is assumed to be a signal of PN sequence code in the conversion processing, the signal resulting from performing the post-processing for D(t) matches dn(t) because of the orthogonality of cn(t), thus conversion of analog signals in batch and signal separation after the conversion are made possible. cn(t) is not limited to a PN signal and may be any signal if it is a random code signal having orthogonality. As the PN signals used here, those used for spread spectrum modulation in mobile communication equipment adopting the CDMA system can be diverted; conversion of analog signals into digital signals in batch can be executed by adding the minimum configuration.

A plurality of signals are thus multiplied by PN signals for performing analog-to-digital conversion, whereby a plurality of detection power values can be converted into digital signals in batch; the number of analog-digital conversion devices can be reduced and the configuration can be simplified as compared with the general method of converting one detection power value from analog form into digital form in one step, so that the unit can be miniaturized and can be manufactured at low costs.

Figure 5:
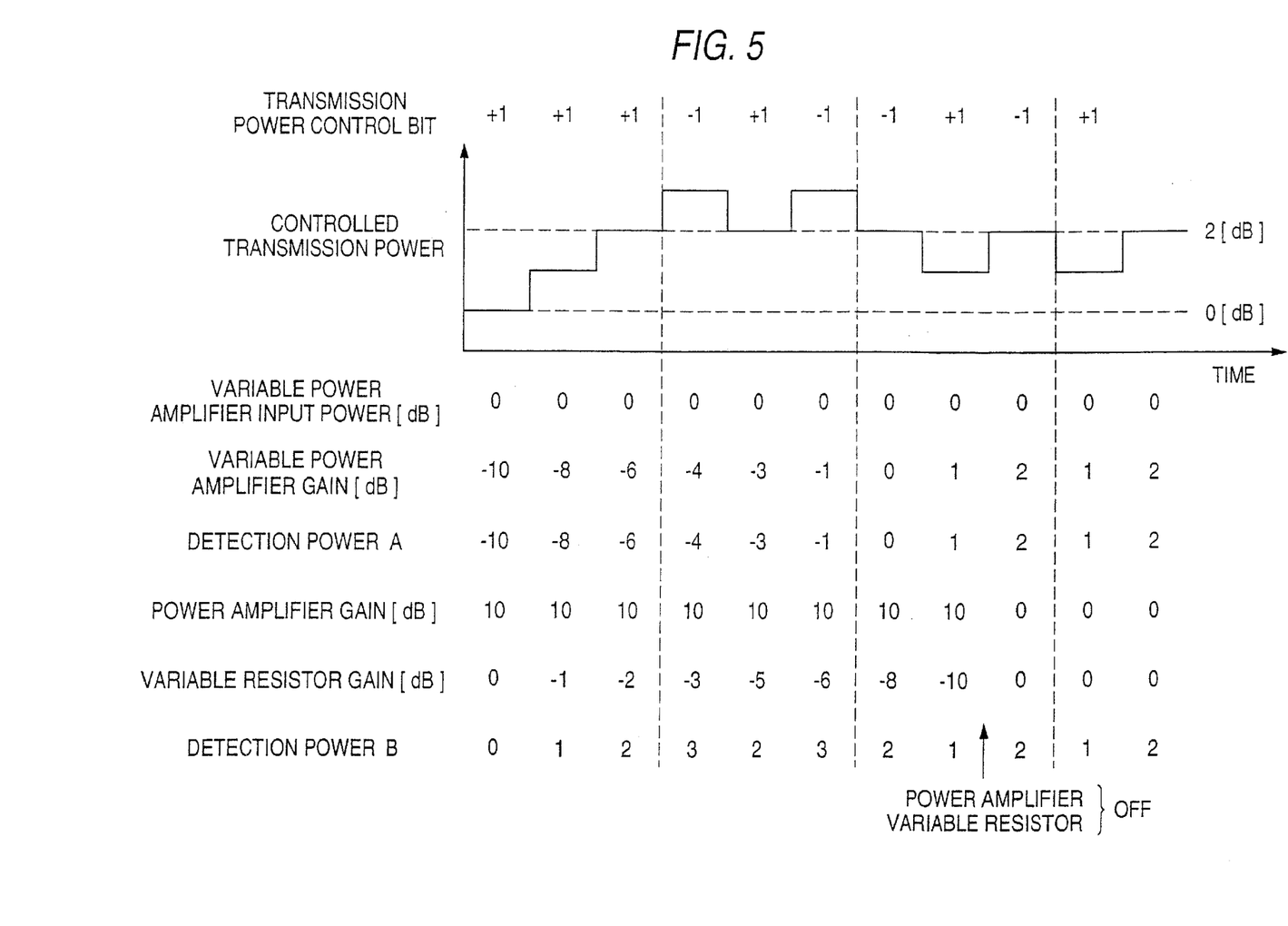
FIG. 5 is a timing chart to show an examples of the transmission power control operation in the embodiment of the invention (control example for repeatedly increasing or decreasing transmission power)
Figure 6:
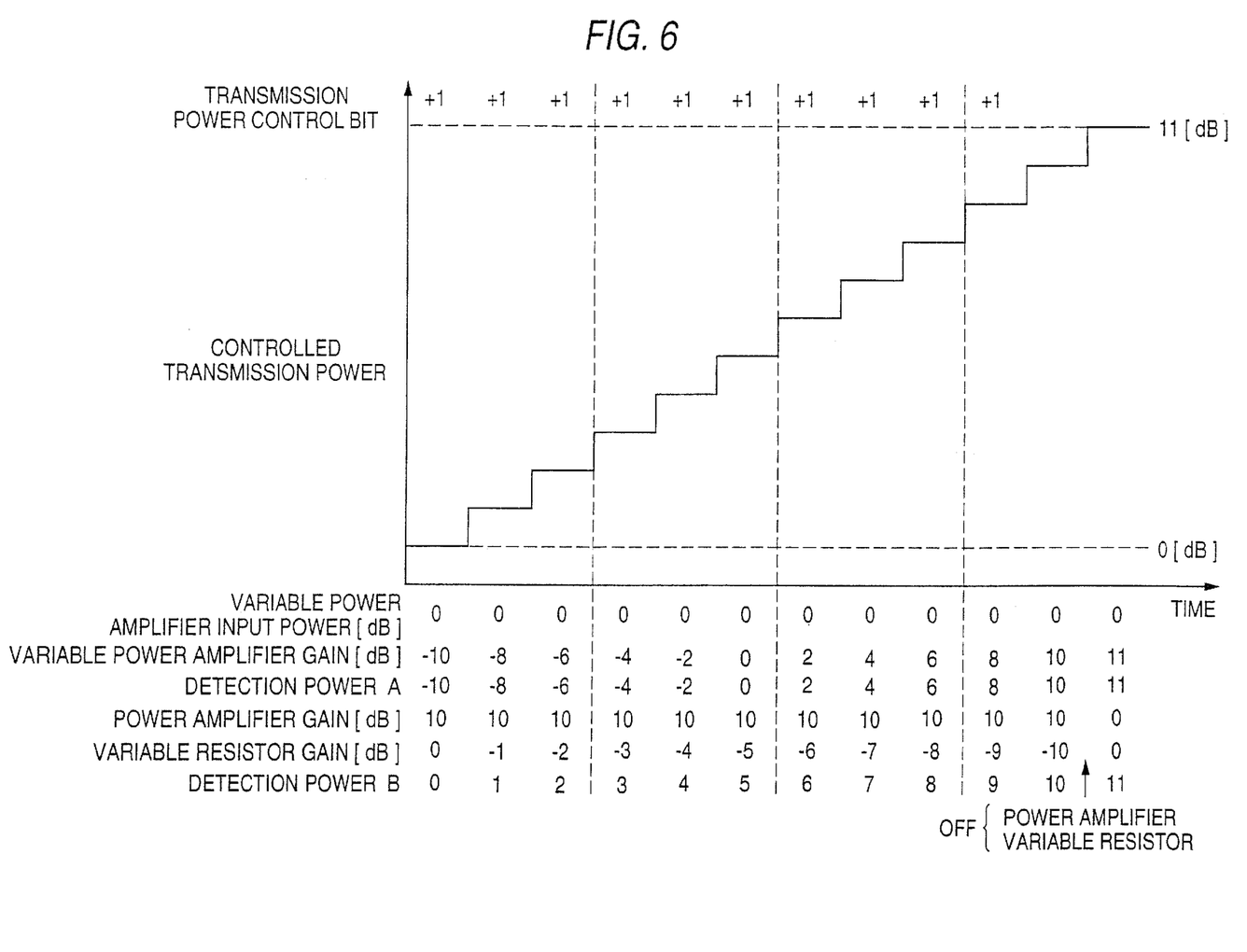
FIG. 6 is a timing chart to show an examples of the transmission power control operation in the embodiment of the invention (control example for monotonously increasing or decreasing transmission power)

FIGS. 5 and 6 are timing charts to show examples of the transmission power control operation. In the examples, the absolute value of the required increment or decrement power is 1 (dB), the tolerance of the required increment or decrement power is 0.3 (dB), an error of per 1-dB control step of the variable resistor and the variable power amplifier is 0.1 (dB), the input power of the variable power amplifier is 0 (dB), and the gain of the power amplifier is 10 (dB). FIG. 5 shows a control example for repeatedly increasing or decreasing transmission power and FIG. 6 shows a control example for monotonously increasing or decreasing transmission power.

In this case, when the transmission power control bit is "+1," the gain of the variable power amplifier is incremented by 2 (dB) and the gain of the variable resistor is decremented by 1 (dB); when the transmission power control bit is "−1," the gain of the variable power amplifier is incremented by 1 (dB) and the gain of the variable resistor is decremented by 2 (dB). When the value of first detection power A (in the example in FIG. 1, detection power detected by the first transmission power detection section 26 (output power of the variable resistor 20)) becomes the same as the value of second detection power B (in the example in FIG. 1, detection power detected by the second transmission power detection section 27 (output power of the variable power amplifier 22)) (the gain of the variable power amplifier also becomes the same value under the above-mentioned condition), the operation of the power amplifier and the variable resistor is turned off. According to such a control method, the variable resistor and the variable power amplifier can be controlled so that the transmission power satisfies the increment or decrement specified in the transmission power control bit and target power; transmission power control of high accuracy is performed.

Referring again to FIG. 2, like the mobile station, the base station also determines a transmission power control bit based on the reception power of a reception wave (desired wave) from the mobile station at step S11, inserts the transmission power control bit into a transmission signal, and transmits the resultant signal to the base station. On the other hand, the mobile station detects at least two or more transmission power (detection power) values of the mobile station at step S5 and converts the detection power values from analog form into digital form at step S6, then determines the detection power difference at step S7. Next, the mobile station receives the signal transmitted from the base station, extracts the transmission power control bit from the reception signal at step S2, and controls the variable resistor and the variable power amplifier as indicated in the transmission power control bit and in accordance with the detection power determination result, thereby varying the gains of the variable resistor and the variable power amplifier for controlling transmission power at step S3. While performing such transmission power control, the mobile station switches the variable resistor and the power amplifier and the variable power amplifier, in accordance with the detection power determination result at step S4.

Steps S3 and S4 are similar to steps 13 and S14. Since the operation of at least one variable power amplification means can be turned off by performing transmission power control and variable power amplification means switch control at the steps, the time period over which power supply to the variable power amplification means is stopped can be prolonged, the number of circuits that can be powered off can be increased, and power consumption can be reduced also in the mobile station like the base station. Step 6 is similar to step S16. According to the step, a plurality of detection power values can be converted into digital signals in batch; the number of analog-digital conversion devices can be reduced and the configuration can be simplified, so that the unit can be miniaturized and can be manufactured at low costs also in the mobile station like the base station.

As described above, in the embodiment, two or more variable power amplification means are provided and two or more transmission power values based on outputs of the variable power amplification means are detected, then transmission power control is performed so that the transmission power difference is eliminated. When the transmission power difference becomes zero, variable power amplification means switch control is performed, whereby the variable resistor and the power amplifier making up one variable power amplification means can be turned off and power supply to the variable power amplification means which is off can be stopped, so that lower power consumption can be intended.

As described above, according to the invention, switch control is performed for the operation of the two or more variable power amplification means containing the variable resistor and the power amplifier and the variable power amplifier in response to the detected transmission power, and power transmitted to the station to communicate with. Thus, there can be provided the radio communication device that can provide transmission power control means for less consuming power in the simple configuration for improving the accuracy of the transmission power control and can be miniaturized with lower power consumption and the transmission power control method in the radio communication device.

The first detection power based on output of the variable resistor and the power amplifier and the second detection power based on output of the variable power amplifier are detected, the variable resistor and the variable power amplifier are controlled in response to the difference between the first detection power and the second detection power and the transmission power control bit sent from the station to communicate with, and the operation of the variable resistor and the power amplifier and the operation of the variable power amplifier are switched in response to the detection power difference. More particularly, while the variable resistor and the variable power amplifier are controlled so that the detection power difference approaches zero, the variable resistor and the power amplifier are turned off when the detection power difference is almost eliminated. Thus, the time period over which power supply to the variable power amplification means is stopped can be prolonged, and the number of circuits that can be powered off can be increased, so that power consumption can be decreased.

The first detection power and the second detection power are multiplied by random code having orthogonality, the results are added, and the resultant signal is converted from analog form into digital form, then the digital signal is multiplied by the above-mentioned random code, and the first detection power and the second detection power can be converted into digital signals in batch, whereby the number of the circuits of the analog-digital converter, etc., can be reduced and the unit can be miniaturized.

What is claimed is:

1. A radio communication device having a transmission power control function of controlling power transmitted to a station to communicate with, said radio communication device comprising:
    variable power amplification means including at least a first variable power amplifier and a second variable power amplifier, each capable of varying its amplification gain;
    variable power amplification control means for controlling said variable power amplification means;
    transmission power detection means for detecting transmission power of said radio communication device based on output of said variable power amplification means; and
    switch control means for performing switch control for the operation of said variable power amplification means in response to the detected transmission power, wherein said variable power amplification means includes a means for bypassing one of said first variable power amplifier and said second variable power amplifier according to a control signal from said switch control means.

2. A radio communication device having a transmission power control function of controlling power transmitted to a station to communicate with, said radio communication device comprising:
    variable power amplification means including a first variable power amplifier capable of varying its amplifier gain and a second variable power amplifier capable of varying its amplification gain;
    variable power amplification control means for controlling said variable power amplification means;
    transmission power detection means for detecting a transmission power of said radio communication device based on output of said variable power amplification means, said transmission power detection means detecting a first detection power based on an output of said first power amplifier and a second detection power based on an output of said second variable power amplifier; and
    switch control means for performing switch control for the operation of said variable power amplification means in response to said transmission power.

3. The radio communication device as claimed in claim 2, wherein
    a detection power difference is the difference between said first detection power and said second detection power, and further wherein
    said variable power amplification control means controls said first variable power amplifier and said second variable power amplifier so that the detection power difference approaches zero, and still further wherein
    said switch control means turns off said first variable power amplifier when said detection power difference is nearly zero.

4. The radio communication device as claimed in claim 2 further comprising analog-digital batch conversion means which includes:
    a first multiplier for multiplying the first detection power and the second detection power by random code having orthogonality;
    an adder for adding output of the first multiplier;
    an analog-digital converter for converting output of the adder into digital signal; and
    a second multiplier for multiplying output of the analog-digital converter by the random code as means for converting the first detection power and the second detection power output from said transmission power detection means into digital signals in batch.

5. A radio communication device having a transmission power control function of controlling power transmitted to a station to communicate with, said radio communication device comprising:
    variable power amplification means including at least a first variable power amplifier capable of varying its amplification gain and a second variable power amplifier capable of varying its amplification gain;
    variable power amplification control means for controlling said variable power amplification means;
    transmission power detection means for detecting a transmission power of said radio communication device based on output of said variable power amplification means; and
    switch control means for performing switch control for the operation of said variable power amplification means in response to the detected transmission power, wherein said transmission power detection means detects a first detection power based on an output of said first power amplifier and a second detection power based on an output of said second variable power amplifier, wherein said variable power amplification control means controls said first variable power amplifier and said second variable power amplifier in response to a transmission power control bit sent from a station to communicate with and a power difference between said first detection power and said second detection power, and wherein said switch control means switches the operation of said first variable power amplifier and the operation of said second variable power amplifier in response to said power difference.

6. A transmission power control method in a radio communication device for controlling power transmitted to a station to communicate with, said transmission power control method comprising:

a variable power amplification control step of controlling a variable power amplification means including a first variable power amplifier and a second variable power amplifier, each capable of varying its amplification gain; and a transmission power detection step of detecting a transmission power of said radio communication device, said transmission power detection step including the steps of:

detecting a first detection power measuring the output power of said first variable power amplifier; and detecting a second detection power measuring the output power of said second variable power amplifier; and a switch control step of performing switch control for the operation of said variable power amplification means in response to said transmission power.

7. The transmission power control method as claimed in claim 6, wherein one of said first and said second variable power amplifiers includes a variable resistor in combination with a power amplifier.

8. The transmission power control method as claimed in claim 6, wherein said variable power amplification control step controls said first and said second variable power amplifiers in response to a transmission power control bit sent from a station to communicate with and a power difference between said first detection power and said second detection power, and wherein said switch control step switches the operation of said first variable power amplifier and the operation of said second variable amplifier in response to said power difference.

9. The transmission power control method as claimed in claim 8, wherein said variable power amplification control step controls said first and said second variable powers amplifiers so that said power difference approaches zero, and wherein said switch control step turns off the variable resistor and the power amplifier when said power difference is nearly zero.

10. The transmission power control method as claimed in claim 8 further comprising:

an analog-digital batch conversion step which includes: a first multiplication step of multiplying said first detection power and said second detection power by random code having orthogonality;

an addition step of adding output of the first multiplication step;

an analog-digital conversion step of converting output of the addition step into digital signal; and a second multiplication step of multiplying output of the analog-digital conversion step by the random code as steps of converting said first detection power and said second detection power output from said transmission power detection step into digital signals in batch.

11. The radio communication device of claim 2, wherein one of said first variable power amplifier and said second variable power amplifier includes a variable resistor combined with a power amplifier.

12. A radio communication device having a transmission power control function of controlling power transmitted to a station to communicate with, said radio communication device comprising:

variable power amplification means including at least first and second variable power amplifiers, each capable of varying its amplification gain;

variable power amplification control means for controlling said variable power amplification means;

transmission power detection means for detecting a first detection power based on an output of said first power amplifier and also for detecting a second detection power based on an output of said second variable power amplifier; and switch control means, wherein said switch control means switches the operation of said first variable power amplifier and said second variable power amplifier in response to the difference between said first detection power and said second detection power.

* * * * *

UNITED STATES PATENT AND TRADEMARK OFFICE
CERTIFICATE OF CORRECTION

PATENT NO.    : 6,438,387 B1  
DATED         : August 20, 2002  
INVENTOR(S)   : Yasufumi Ichikawa et al.

It is certified that error appears in the above-identified patent and that said Letters Patent is hereby corrected as shown below:

Title page,
Item [56], References Cited, U.S. PATENT DOCUMENTS, please delete "5,265,935", and insert therefor -- 6,265,935 --.

Column 10,
Line 42, please delete "," (comma).

Signed and Sealed this

Twenty-eighth Day of January, 2003

JAMES E. ROGAN
*Director of the United States Patent and Trademark Office*